United States Patent [19]

Warner et al.

[11] Patent Number: 4,518,920

[45] Date of Patent: May 21, 1985

[54] FREQUENCY SYNTHESIZER AND METHOD

[75] Inventors: Andrew Warner, Harvard, Mass.; David A. Zlotek, Nashua, N.H.

[73] Assignee: Klimsch/Optronics, Inc., Chelmsford, Mass.

[21] Appl. No.: 384,611

[22] Filed: Jun. 3, 1982

[51] Int. Cl.³ ............................................. H03L 7/16
[52] U.S. Cl. .................................. 328/14; 364/703; 328/120
[58] Field of Search ................... 328/14, 120; 364/703

[56] References Cited

U.S. PATENT DOCUMENTS

| | | | |
|---|---|---|---|
| 4,325,031 | 4/1982 | Ooms et al. | 328/14 |
| 4,344,036 | 8/1982 | Dakroub et al. | 364/703 |
| 4,365,201 | 12/1982 | Scott et al. | 328/14 |
| 4,423,381 | 12/1983 | Stepp et al. | 328/14 |

Primary Examiner—John S. Heyman
Attorney, Agent, or Firm—Thompson, Birch, Gauthier & Samuels

[57] ABSTRACT

A frequency synthesizer and method for producing an output pulse based upon a mathematical calculation with the output pulse synchronized to an input pulse train on a pulse-by-pulse basis.

7 Claims, 1 Drawing Figure

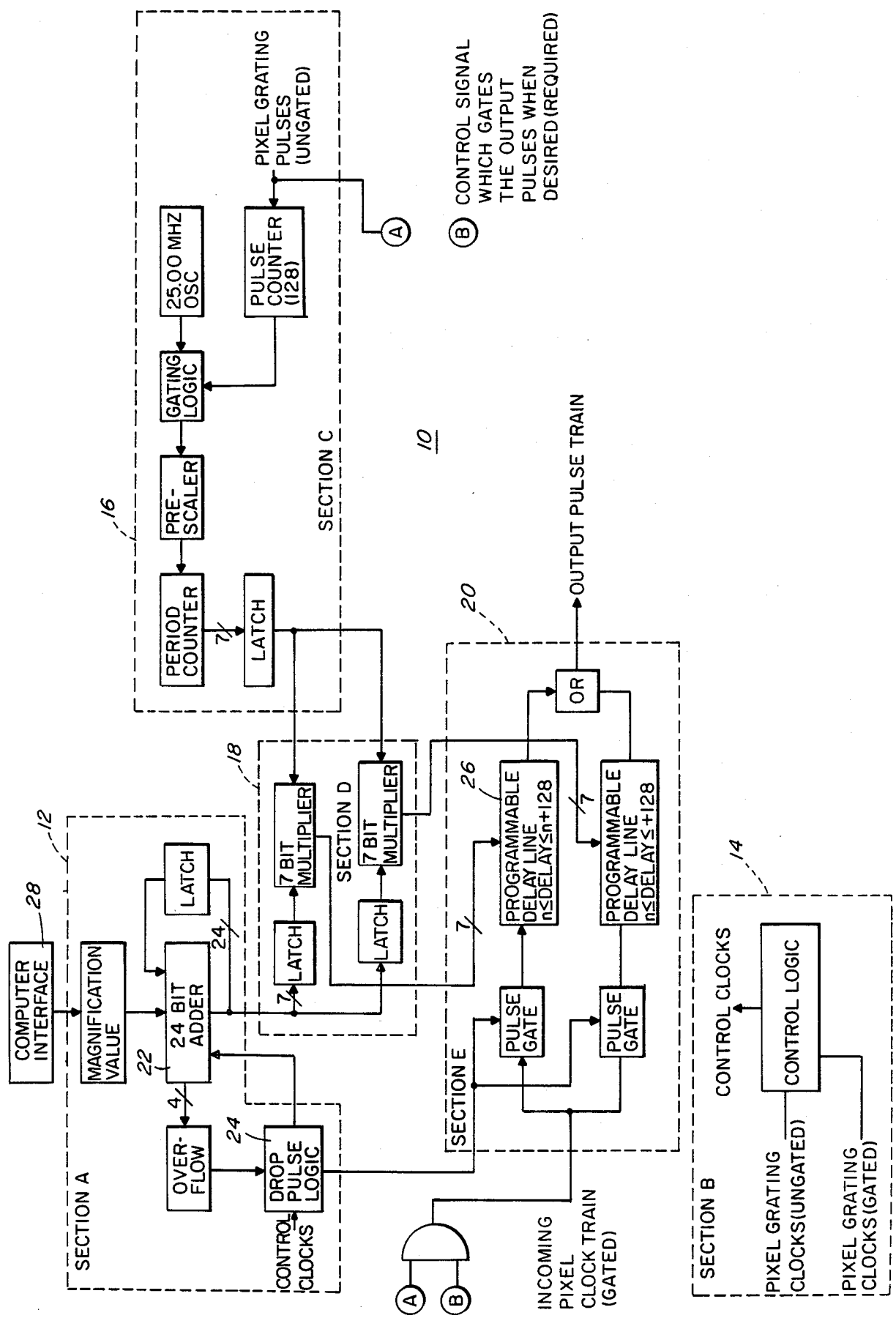

FREQUENCY SYNTHESIZER AND METHOD

BACKGROUND OF THE INVENTION

The present invention relates to frequency synthesizers in general, and more particularly, to a frequency synthesizer that produces an output pulse based upon a mathematical calculation with the output pulse synchronized to an input pulse train on a pulse-by-pulse basis.

In image processing applications it is often desirable to alter the size of a scanned image on a real-time basis. Generally such a process is referred to as image magnification. However, the actual theory and hardware described herein functions in a manner to provide changes from 1X to some fraction of 1X in the size of the original copy. Thus, the concept of changing the size of an image becomes a demagnification exercise. The problem of adjusting the size of an image to a value greater than 1X is accomplished by employing an additional pre-processing step of 2X, or greater, enlargement, and then de-magnifying that intermediate result to obtain the desired output size.

The concept of demagnification is related to deriving a preselectable output frequency from a given input frequency. Basic demagnification can be accomplished by employing a standard phase locked loop (PLL) design that contains a feedback counter functioning as a programmable divider. Commercial radio equipment employs this technique to derive different transmit and/or receive frequencies.

The problem, however, is that in a PLL system with divide by N counter feedback, only a very limited (relatively speaking) number of output frequencies can be realized. The PLL technique requires that the feedback counter be some integer value. This integer value constructs the new output frequency, as a function of the designed channel spacing.

Some image processing applications require that extremely small, and in some cases, non-integer value channel step sizes, be employed to process real time picture information and to reduce this copy in increments of 0.1 percent. A conventional PLL cannot be used in these applications. Furthermore, in addition to the limited number of output frequencies available from a PLL, the output pulse inaccuracies present when a PLL system is searching for lock, are intolerable in such applications.

It is accordingly a general object of the invention to provide an improved frequency synthesizer.

It is a specific object of the invention to provide a frequency synthesizer that produces an output pulse based upon a mathematical calculation that is synchronized to an input pulse train on a pulse-by-pulse basis.

It is a feature of the invention that the frequency synthesizer produces an output pulse train having a frequency that is a selected fractional percent of the frequency of the input pulse train.

It is another feature of the invention that the invention can be implemented with conventional and readily available electronic components.

BRIEF DESCRIPTION OF THE DRAWINGS

These objects and features and other objects and features will best be understood from a detailed description of a preferred embodiment of the invention selected for purposes of illustration and shown in the accompanying single FIGURE which is a block diagram of the frequency snythesizer of the present invention.

DETAILED DESCRIPTION OF A PREFERRED EMBODIMENT

The mathematical concept that was employed to develop the frequency synthesizer technique can be stated simply by saying that the number of output pulses must be a certain percentage of the number of input pulses. The desired, although not limiting, range of operation was within 20 to 100 percent. This restricts the hardware to an equal to or less than output situation, relative to the number of input pulses received.

Dropping pulses at a preselected ratio, however, is not a complete solution to the problem. The remaining pulses need to be placed in such a manner as to provide a continuously uniform output. Each output pulse must, therefore, be "slipped" a certain percentage from its corresponding input pulse, relative to the next input pulse.

The development of this mathematical model is best described by way of an example. Consider the following requirement: establish an output waveform that is 80 percent of an incoming pulse train. Note that any percent reduction could be selected that lies within the desired range of $0.2 \leq f_{out} \leq 1.0$. However, this particular value simplifies the mathematics necessary for illustrative purposes.

For this example:

$$f_{out} = 0.8 f_{in} \text{ or } f_{in} = 1.25 f_{out}$$

This means that for every 1.25 input pulses, one pulse should be output. The spacing of the output pulses, relative to the input pulses, is equal to the fractional value of repeated additions when the reciprocal value of the percent output is added to the accumulated value of all additions.

For the 80 percent example:

```
 add 1.25   Starting value
   + 1.25   Reciprocal of ratio
    2.50   Sum 1
   + 1.25
    3.75   Sum 2
   + 1.25
    5.00   Sum 3
   + 1.25
    6.25   Sum 4
     etc.
```

For this example, the pulse spacing becomes 0.50, 0.75, 0.00, 0.25. Note, however, that the integer value from Sum 2 to Sum 3 increases in magnitude by a value greater than one count. When this situation occurs, input pulses must be dropped; the exact number of which can be calculated by evaluating the following expression.

[Pulse Drop] × [Integer After Add] − [Integer Before Add] − 1

Adding the pulse drop information to the pulse spacing completes the data necessay for output waveform generation.

The output waveform can be developed for the presented example by using the following figures:

| Input Pulse | Output Pulse |
| --- | --- |
| 1 | Slipped 50% in the period from input pulse 1 to input pulse 2 |
| 2 | Slipped 75% in the period from input pulse 2 to input pulse 3 |
| 3 | Drop this pulse |
| 4 | Slipped 00% . . . etc. |
| 5 | Slipped 25% . . . etc. |

The development of the mathematics to this level has, however, assumed a pulse period equal to 1 unit of time. In order to add physical significance to the mathematical calculations of percent slip, the fractional values of the calculated sums must be multiplied with the actual period between two input pulses in whatever engineering units are appropriate (milliseconds, microseconds, nanoseconds, etc.).

The multiplication products represents the physical amount of time that each output pulse should be delayed from each input pulse to provide a uniformly spaced output waveform. Once this value is determined, the mathematical part of the problem is complete.

Turning now to the single FIGURE of the drawings, there is shown in block diagram form a frequency snythesizer constructed in accordance with the present invention and indicted generally by the reference numeral 10. The frequency synthesizer 10 circuit can be divided into five major sections: one, an adder with pulse slip logic 12; two, frequency synthesizer control logic 14; three, a period averager 16; four, a multiplier 18; and five, a programmable delay 20.

Frequency synthesizer sections 12 and 14 depict the functional elements used to provide a high level control over the frequency synthesis process. A 24-bit adder 22 shown in section 12 performs the repeated arithmetic additions which calculate the percent slip value. Only the 7 bits to the right of the decimal point are carried to the multiplier networks of section 18. It will be appreciated that the length of the word for this calculation directly affects the accuracy of the result.

The four most significant bits of the adder 22 provide the potential pixel drop information to drop pulse logic 24. The drop pulse logic 24 controls the rate at which the 24-bit adder calculates the next percent slip value. When the results of a previous addition require that one or more clocks be dropped, the pulse block logic provides the proper delay before re-enabling the adder chain.

Shown below is a bit-by-bit representation of the 24-bit adder.

| XX XX . XX XX XX XX | XX XX XX XX XX XX |
| --- | --- |
| Integer | 7-Bit Fraction To Multiplier | Used to Increase The Accuracy of Calculations And For Very Small Reduction Calculations |

Decimal Point

Section 14 depicts the control logic for the entire frequency synthesizer. The most important control function is to provide an orderly start and stop sequence of clocks to the arithmetic sections of the synthesizer.

Section 16 depicts the period averager of the frequency synthesizer. This section of the synthesizer measures the period between incoming pulses by averaging the value over a predetermined number e.g., 128 input clocks. The theory of operation is basically the same as a frequency counter, with the resultant value equal to units of time, rather than frequency.

The incoming pulse train from the host system (not shown) is frequency modulated from 8 to 20 megahertz. Therefore, in order to provide the proper multiplier unit, a measurement technique is employed that constantly updates the value of the period between pulses. The number of pulses used to provide the average period value is a function of the total system accuracy and the frequency of the measurement standard.

It will be understood that the incoming pulse train does not have to be frequency modulated and that conceptually the period averager 16 produces an output that is the average period value of the unknown frequency of the input pulse train over some predetermined number of clock pulses.

The output of multiplier section 18, after being latched, is driven into two programmable delay lines 26 each comprising a series of fixed delay logic modules. Each fixed delay module can assume one of two operating states: delay or bypass.

By way of illustration only, where the input waveform can vary in frequency from 8 to 20 megahertz, the analog delay modules are selected to be:

a. 80 nanoseconds
b. 40 nanoseconds
c. 20 nanoseconds
d. 10 nanoseconds
e. 5 nanoseconds
f. 2.5 nanoseconds Since each delay module is individually controlled with one bit from the multiply product, the output pulse can be delayed from the input pulse by a discrete amount, adjustable in 2.5 nsec step increments.

For example, to delay a pulse 97.5 nsec, the individual module delays would be configured as shown below:

| | Delay ON | Delay OFF |
| --- | --- | --- |
| a. | 80 | |
| b. | | 40 |
| c. | | 20 |
| d. | 10 | |
| e. | 5 | |
| f. | 2.5 | |
| | 97.5 nsec | |

Selection of the longest delay to satisfy the intended application is a function of the minimum input frequency. The sum total of all delay modules equals or slightly exceeds the maximum period that is processed.

The selection of the step size is a trade-off between the desired percent slip placement accuracy and the realizable minimum step size from an implementation point view.

Conceptually, only one multiplier and one programmable delay line are needed to slip input pulses. However, to implement the functon and the examples presented above, an A/B channel mode of operation is illustrated. As one pulse is making its way through one programmable delay line, the other delay line is being programmed for the next pulse. The output of the two delay lines is then logically "ored" together to obtain the desired output waveform.

The use of a dual multiplier arrangement, one driving each delay line, is based upon the required time to perform the 7-bit multiplication. The maximum input operating frequency of 20 megahertz dictates the dual deployment of multiplier arrays.

Since the frequency synthesizer described above represents a functional block of a much larger system, the necessary set-up parameters for proper operation are obtained through a computer interface 28. The registers that are serviced by the host processor (not shown) are:
a. magnification value-3 bytes
b. initial pulse delay-3 bytes
c. pulse drop-1 byte
d. control register-1 byte Having described in detail a preferred embodiment of our invention, it will now be apparent to those skilled in the art that numerous modifications can be made therein without departing from the scope of the invention as defined in the following claims.

What we claim and desire to secure by Letters Patent of the United States is:

1. A method for synthesizing a variable frequency that is less than the variable frequency of an input pulse train, said method comprising the steps of:
   (1) selecting a percent reduction of the variable frequency of the input pulse train;
   (2) determining the reciprocal value of the percent reduction;
   (3) generating a variable output pulse train; and,
   (4) varying the spacing of the variable output pulse train pulses so that their spacing relative to the variable input pulse train pulse is equal to the fractional value of repeated additions when the reciprocal value of the percent reduction is added to the accumulated value of all additions.

2. The method of claim 1 further comprising the step of dropping pulses from the variable input pulse train in accordance with the following formula:

[Pulse Drop]=[Integer After Add]−[Integer Before Add]−1.

3. A method for synthesizing a variable frequency that is less then the variable frequency of an input pulse train, said method comprising the steps of:
   (1) dropping pulses from the variable input pulse train at a predetermined ratio to produce a variable intermediate pulse train; and,
   (2) slipping each variable intermediate pulse train pulse a predetermined percentage from its corresponding input pulse, relative to the next input pulse to produce an output pulse train of the desired variable frequency.

4. An apparatus for synthesizing a variable frequency that is less than the variable frequency of an input pulse train, said apparatus comprising:
   (1) means responsive to a variable frequency input pulse train for producing an output pulse train having a variable frequency that is a predetermined percent reduction of the variable frequency of the input pulse train; and,
   (2) means for varying the spacing of the output pulse train pulses so that their spacing relative to the input pulse train pulses is equal to the fractional value of repeated additions when the reciprocal value of the percent reduction is added to the accumulated value of all additions.

5. The apparatus of claim 4 further comprising means for dropping pulses from the input pulse train in accordance with the following formula:

[Pulse Drop]=[Integer After Add]−[Integer Before Add]−1.

6. An apparatus for synthesizing a variable frequency that is less than the variable frequency of an input pulse train, said apparatus comprising:
   (1) means responsive to a variable frequency input pulse train for dropping pulses from the input pulse train at a predetermined ratio to produce a variable frequency intermediate pulse train; and,
   (2) means for slipping each intermediate pulse a predetermined percentage from its corresponding input pulse, relative to the next input pulse to produce a variable frequency output pulse train of the desired frequency.

7. A method for synthesizing an output pulse train having a frequency that is less than the frequency of an input pulse train, said method comprising the steps of:
   (1) determining the necessity for an output pulse and the percent slip of that output pulse related to the desired reduction of the input pulse train on a pulse-by-pulse basis;
   (2) determining the period average value of the input pulse train for a plurality of periods;
   (3) multiplying each such period average value of the input pulse train with the percent slip to determine in actual time units where the output pulse should be with respect to the synthesizing input pulse; and,
   (4) generating an output pulse in accordance with such determinations.

* * * * *